United States Patent
Rinko

(10) Patent No.: US 11,692,685 B2
(45) Date of Patent: Jul. 4, 2023

(54) LAMINATE STRUCTURE WITH EMBEDDED CAVITIES AND RELATED METHOD OF MANUFACTURE

(71) Applicant: Nitto Denko Corporation, Osaka (JP)

(72) Inventor: Kari Rinko, Helsinki (FI)

(73) Assignee: Nitto Denko Corporation, Osaka (JP)

(*) Notice: Subject to any disclaimer, the term of this patent is extended or adjusted under 35 U.S.C. 154(b) by 422 days.

(21) Appl. No.: 16/232,558

(22) Filed: Dec. 26, 2018

(65) Prior Publication Data

US 2019/0128498 A1    May 2, 2019

Related U.S. Application Data

(63) Continuation of application No. 13/640,066, filed as application No. PCT/FI2011/050300 on Apr. 6, 2011, now abandoned.

(Continued)

(51) Int. Cl.
    F21V 5/00       (2018.01)
    H01L 31/048     (2014.01)
    (Continued)

(52) U.S. Cl.
    CPC ............ F21V 5/00 (2013.01); B29D 11/0073 (2013.01); B32B 17/06 (2013.01); B32B 37/142 (2013.01);
    (Continued)

(58) Field of Classification Search
    CPC ......... F21V 5/00; B32B 17/06; B32B 37/142; B32B 38/06; B32B 37/12; B32B 38/145;
    (Continued)

(56) References Cited

U.S. PATENT DOCUMENTS

| | | | |
|---|---|---|---|
| 5,396,350 A |   | 3/1995 | Beeson et al. |
| 5,426,879 A | * | 6/1995 | Hecker .................. G09F 13/08 |
| | | | 362/812 |

(Continued)

FOREIGN PATENT DOCUMENTS

| | | |
|---|---|---|
| CN | 1997922 A | 7/2007 |
| CN | 101617252 A | 12/2009 |

(Continued)

OTHER PUBLICATIONS

Brazilian Opinion for Brazilian Patent Application No. BR112012025700-5 dated Jul. 17, 2019 (8 pages, including English translation).

(Continued)

*Primary Examiner* — David Sample
*Assistant Examiner* — Donald M Flores, Jr.
(74) *Attorney, Agent, or Firm* — Eversheds Sutherland (US) LLP

(57) ABSTRACT

An integrated laminate structure adapted for application in the context of solar technology, wafer technology, cooling channels, greenhouse illumination, window illumination, street lighting, traffic lighting, traffic reflectors or security films, includes a first carrier element such as a piece of plastic or glass, optionally having optically substantially transparent material enabling light transmission therethrough, a second carrier element provided with at least one surface relief pattern including a number of surface relief forms and having at least one predetermined optical function relative to incident light, the second carrier element optionally including optically substantially transparent material enabling light transmission therethrough, the first and second carrier elements being laminated together such that the at least one surface relief pattern has been embedded within the established laminate structure and a number of related (Continued)

cavities have been formed at the interface of the first and second carrier elements. An applicable method of manufacture is presented.

19 Claims, 6 Drawing Sheets

Related U.S. Application Data

(60) Provisional application No. 61/388,233, filed on Sep. 30, 2010, provisional application No. 61/282,818, filed on Apr. 6, 2010.

(51) Int. Cl.
| | |
|---|---|
| *H01L 31/054* | (2014.01) |
| *B29D 11/00* | (2006.01) |
| *B32B 37/14* | (2006.01) |
| *B32B 38/06* | (2006.01) |
| *G02B 6/10* | (2006.01) |
| *G02B 6/42* | (2006.01) |
| *B32B 17/06* | (2006.01) |
| *B32B 37/12* | (2006.01) |
| *B32B 38/00* | (2006.01) |

(52) U.S. Cl.
CPC ............. *B32B 38/06* (2013.01); *G02B 6/10* (2013.01); *G02B 6/42* (2013.01); *H01L 31/048* (2013.01); *H01L 31/0543* (2014.12); *H01L 31/0547* (2014.12); *B29D 11/00346* (2013.01); *B32B 37/12* (2013.01); *B32B 38/145* (2013.01); *Y02E 10/52* (2013.01); *Y10T 156/10* (2015.01); *Y10T 156/1039* (2015.01); *Y10T 428/24364* (2015.01); *Y10T 428/24562* (2015.01)

(58) Field of Classification Search
CPC ......... G02B 6/10; G02B 6/42; H01L 31/0543; H01L 31/0547; H01L 31/048; H01L 31/0236; B29D 11/0073; B29D 11/00346; B29D 11/00788; Y10T 156/1039; Y10T 156/10; Y10T 428/24562; Y10T 428/24364; Y02E 10/52
See application file for complete search history.

(56) References Cited

U.S. PATENT DOCUMENTS

| | | | |
|---|---|---|---|
| 5,552,907 A * | 9/1996 | Yokota | F21V 5/04 |
| | | | 362/625 |
| 7,010,212 B2 * | 3/2006 | Emmons | G02B 6/0025 |
| | | | 362/602 |
| 7,345,824 B2 | 3/2008 | Lubart et al. | |
| 7,467,886 B2 | 12/2008 | Kimura et al. | |
| 8,425,102 B2 | 4/2013 | Rinko | |
| 8,696,216 B2 | 4/2014 | Sano et al. | |
| 8,746,931 B1 | 6/2014 | Rinko | |
| 2002/0129850 A1 | 9/2002 | Nomura | |
| 2003/0086159 A1 * | 5/2003 | Suzuki | G02B 1/111 |
| | | | 359/885 |
| 2004/0229394 A1 | 11/2004 | Yamada et al. | |
| 2005/0064142 A1 | 3/2005 | Matsunaga et al. | |
| 2006/0021267 A1 | 2/2006 | Matsuda et al. | |
| 2007/0133094 A1 | 6/2007 | Walton et al. | |
| 2007/0223252 A1 | 9/2007 | Lee et al. | |
| 2007/0231542 A1 | 10/2007 | Deng et al. | |
| 2007/0268560 A1 | 11/2007 | Chopra | |
| 2008/0000517 A1 | 1/2008 | Gonsiorawski et al. | |
| 2008/0259248 A1 | 10/2008 | Shimazaki et al. | |
| 2008/0267572 A1 | 10/2008 | Sampsell et al. | |
| 2009/0213464 A1 * | 8/2009 | Kurachi | G02B 5/0242 |
| | | | 359/599 |
| 2010/0142200 A1 | 6/2010 | Huang | |
| 2011/0170184 A1 | 7/2011 | Wolk | |
| 2012/0138146 A1 | 6/2012 | Furuhata et al. | |
| 2018/0292066 A1 * | 10/2018 | Rinko | B32B 38/06 |

FOREIGN PATENT DOCUMENTS

| | | |
|---|---|---|
| EP | 1988333 A1 | 11/2008 |
| JP | S5210697 A | 1/1977 |
| JP | S61198188 A | 9/1986 |
| JP | 3015946 | 9/1995 |
| JP | H08221013 A | 8/1996 |
| JP | 2002071912 | 3/2002 |
| JP | 2005164851 A | 6/2005 |
| JP | 2007286289 A | 11/2007 |
| JP | 2007328314 A | 12/2007 |
| JP | 2008510183 A | 4/2008 |
| JP | 2008103272 A | 5/2008 |
| JP | 2009048152 A | 3/2009 |
| JP | 2009076235 A | 4/2009 |
| JP | 2009199927 A | 9/2009 |
| JP | 2010526341 A | 7/2010 |
| JP | 5174966 B2 | 4/2013 |
| JP | 2013161639 A | 8/2013 |
| KR | 20090002875 | 1/2009 |
| WO | 2004038462 A1 | 5/2004 |
| WO | 2007043383 A1 | 4/2007 |
| WO | 2008097507 A1 | 8/2008 |
| WO | 2009108832 A1 | 9/2009 |

OTHER PUBLICATIONS

Brazilian Opinion for Brazilian Patent Application No. BR112012025700-5 dated Apr. 6, 2011 (8 pages, including English translation).
European Summons to Attend Oral Proceedings for European Patent Application No. 11765140.6 mailed Jul. 11, 2019 (8 pages).
Notification of Reason for Refusal for Korean Patent Application No. 10-2012-7029164, dated Jul. 29, 2019 (10 pages, including English translation).
Non-Final Office Action for U.S. Appl. No. 13/080,897 dated Sep. 3, 2019 (14 pages).
Indian Office Action for IN Application No. 2519/MUMNP/2012 dated Mar. 15, 2021 (2 pages).
Office Action for U.S. Appl. No. 13/080,897 dated Aug. 27, 2020 (17 pages).
Office Action for Korean Patent Application No. 10-2012-7029164, dated Apr. 10, 2019 (7 pages, including English translation).
Corean Office Action for KR Application No. 10-2012-7029164 dated Apr. 7, 2020 (12 pages, with English translation).
PCT International Search Report for PCT Application No. PCT/FI2011/050300 dated Jul. 12, 2011.
Extended European Search Report, dated Nov. 14, 2014, from corresponding EP application.
Japanese Office Action, dated Mar. 17, 2015, from corresponding JP application, translation provided.
Translation of Chinese Search Report, dated May 13, 2014, from corresponding CN application.
Japanese Office Action dated Jan. 26, 2016, with English Translation; Application No. 2013-503150.
European Search Report for EP Application No. 20178949.2 dated Sep. 25, 2020 (8 pages).
Non-Final Office Action dated Oct. 25, 2021 for U.S. Appl. No. 13/080,897.
Indian Office Action for IN Application No. 2519/MUMNP/2012 dated Sep. 2, 2021 (3 pages).
Final Office Action issued in U.S. Appl. No. 16/982,313, dated Sep. 30, 2021, 9 pages.
Communication pursuant to Article 94(3) EPC issued in European application No. 20178949.2, dated Apr. 26, 2022, 6 pages.
Final Office Action dated Jun. 7, 2022, for U.S. Appl. No. 13/080,897.

(56) References Cited

OTHER PUBLICATIONS

Non-Final Office Action issued in U.S. Appl. No. 13/080,897, dated Nov. 21, 2022, 21 pages.

* cited by examiner

LAMINATE STRUCTURE WITH EMBEDDED CAVITIES AND RELATED METHOD OF MANUFACTURE

CROSS-REFERENCE TO RELATED APPLICATIONS

This application is a continuation application of U.S. patent application Ser. No. 13/640,066, filed Oct. 9, 2012, which is a U.S. national stage entry of PCT/FI2011/050300, filed Apr. 6, 2011, which claims priority to U.S. Provisional Patent Application No. 61/388,233, filed Sep. 30, 2010, and U.S. Provisional Patent Application No. 61/282,818, filed Apr. 6, 2010. The contents of U.S. patent application Ser. No. 13/640,066, international application no. PCT/FI2011/050300, U.S. Provisional Patent Application No. 61/388,233, and U.S. Provisional Patent Application No. 61/282,818 are incorporated herein by reference.

FIELD OF THE INVENTION

Generally, most embodiments of the present invention pertain to optics. In particular, however not exclusively, the present invention concerns laminate structures with embedded, optically functional cavities and manufacturing thereof.

BACKGROUND

Traditionally microstructures such as microprisms or gratings of different optics-containing devices such as lighting apparatuses and electronic apparatuses have been exclusively produced on surface areas of optically transparent substrates. These structures may have been originally configured to (re)direct, couple or otherwise interact with the incident light in a certain predetermined manner, but positioning thereof on the surface of the material has typically caused a number of problems and defects arising, if not immediately, at least in the long term.

Namely, optically meaningful surface relief structures such as coupling optics are very often subjected, naturally depending on the use scenario, to stress caused by various external factors such as contamination due to dust, sand, water, grease and dirt in general. In addition, the surface forms are generally vulnerable to impacts by external objects, which may break, deform and damage these delicate structures of potentially just micrometer or nanometer size, for example. Even the pressure introduced by a purposefully contacted external element may damage the surface structure patterned on the contact surface and hinder the desired function thereof.

To illustrate some of the above issues, FIG. 1a visualizes, particularly in the exemplary context of solar cells, two initial problems that may also occur together in the same use scenario generally incorporating light propagation and medium boundaries. On the left, the light emitted by a light source such as the sun and incident 106 on a cover glass 102 of a solar cell 104 with a noticeable angle of incidence is undesirably partially reflected 108 from the surface of the cover glass 102 at the air-glass interface. Secondly, the light fraction passed into the cover glass 102 is still further partially reflected internally 110 from the glass-solar cell interface 103. Provided that the external medium is air, the corresponding refractive indexes may be nair, n1 and n2 for the medium, material of the glass and for the top portion of the cell, respectively. Ultimately, merely a limited amount of incident light such as the light rays 112 that are substantially perpendicularly incident on the cover glass 102 may thus pass through the cover glass 102 and enter the solar cell 104 without considerable amount of related electromagnetic energy lost due to reflections at the interfaces encountered on the overall optical path. Thereby, the range of incident angles enabling efficient incoupling and total efficiency remains narrow.

To cope with the afore-explained interfaces and to improve the coupling efficiency, a solution substantially following the one of FIG. 1b could be considered. The outmost layer 102, such as the above cover glass protecting the underlying solar cell 104 and thus being again the first element to receive the incident light, has been provided with a surface relief pattern 114 configured to couple and redirect the light towards the cell 104 within a predetermined angle. The pattern may have been specifically constructed to redirect the light rays 120 more perpendicularly to the cell 104, for example. However, as the structure is obviously easily contaminated by additional material 118 such as dust particles or water droplets stuck into the recesses defined by the surface relief forms, the effect of the pattern 114 sooner or later turns out inferior as at least part of the incident light is actually reflected by the contamination 118 and/or is coupled towards the cell 104 in somewhat random angle, which may cause further undesired reflections at the glass-cell boundary 103 and cause reduced overall efficiency of the provided structure.

Still staying in the exemplary context of solar cells, the achieved overall efficiency of the contemporary solutions may be surprisingly low, possibly around 15% or below, greatly due to the contamination-induced reflections and miscoupling, surface reflections, internal reflections, such as reflections at medium boundaries between e.g. ITO (indium tin oxide) layer and other layers commonly applied in the solar cells' optical structures. Major portion of the sunlight incident on the optical structure comprising the solar cell is not utilized because certain incident angles are basically disregarded by the conventional optics utilized therewith. In other words, in the illustrated context of solar energy one could say that only direct sunlight reaching the solar cell vertically adds to the efficiency of the solar cell that is thus extremely sensitive to the sun position.

Historically, even the use of laser has been suggested in generating internal, localized changes e.g. in the refractive index of a carrier material to emulate internal gratins therewith. Also specific coatings of predetermined high or low refractive index have been applied on the substrate structures for controlling light propagation therein. Nevertheless, even these and other contemporary solutions have turned out too restrictive, performance-wise inadequate, complex and expensive in the light of widespread industrial scale utilization.

SUMMARY

Thereby, the objective is to alleviate one or more problems described hereinabove not yet satisfactorily addressed by the current arrangements, and to provide a feasible alternative for producing various functional structures such as optically functional structures.

The objective is achieved by the embodiments of a laminate structure and a related method of manufacture in accordance with the present invention. It shall be noted that this summary is generally provided to introduce a selection of concepts that are further described below in the detailed description. However, this summary is not intended to specifically identify the sole important or, in particular, essential features of the claimed subject matter and thus limit the claimed subject matter's scope.

Accordingly, in one aspect of the present invention an integrated laminate structure adapted for application in the context of solar technology, wafer technology, cooling channels, greenhouse illumination, window illumination, street lighting, traffic lighting, traffic reflectors or security films, comprises a first carrier element, such as a piece of plastic or glass, optionally comprising optically substantially transparent material enabling light transmission therethrough, a second carrier element, such as a piece of plastic or glass, provided with at least one surface relief pattern comprising a number of surface relief forms and having at least one predetermined optical function relative to light incident thereon, said second carrier element optionally comprising optically substantially transparent material enabling light transmission therethrough, the first and second carrier elements being laminated together such that the at least one surface relief pattern has been embedded within the established laminate structure and a number of related, optically functional cavities have been formed at the interface of said first and second carrier elements.

Preferably either or both the carrier elements comprise optically substantially transparent material, but in some embodiments at least one of the elements may be optically substantially non-transparent and/or comprise non-transparent material depending on the particular use scenario in question. It may be e.g. opaque or translucent.

Preferably, the laminated elements are securely joined together by lamination so that no undesired gaps such as air gaps, naturally excluding the desired, preferably optically functional cavities created by the at least one embedded surface relief pattern, remain therebetween. Further, one shall generally notice that when a surface relief pattern or form of a carrier element is embedded during lamination, it does not appear on the surface of the constructed laminate structure and is not a surface relief pattern or form of the structure.

Yet, in optical applications the patterned laminate layers with the same refractive index may form a single element in terms of optical function relative to light incident thereon.

In some embodiments, the first carrier element may be provided with at least one surface relief pattern having a predetermined optical function relative to light incident thereon and comprising a number of surface relief forms. The pattern may be on the side facing the second carrier element upon and after lamination (embedded), or on the opposite side, for example. In the latter case, the pattern may remain on the surface of the structure or be covered e.g. by a further element and be thus embedded. The patterns of the first and second carrier elements may form an aggregate multilayer pattern having at least one common function, for example. A carrier element, such as the first or second carrier element, may generally be substantially planar, but also other shapes are possible.

In some embodiments, the at least one surface relief pattern of the second carrier and/or of the first carrier element preferably embedded within the laminate structure may indeed be configured to define a number of preferably optically functional cavities therein optionally together with the facing portion of the first carrier and/or second element, respectively, at the interface thereof. An embedded, closed cavity may be e.g. a micro-cavity or a nano-cavity as to the size thereof. The cavities may contain a number of materials potentially different from the materials of the first and/or second carrier elements. A cavity may include or be filled with fluid such as air, suitable liquid, and/or solid. A cavity may include gel. Ink may also be applied. Ink may be transparent or colored. The substances may have been selected so as to provide a predetermined optical performance in terms of e.g. refractive index. The refractive index may differ from the one of the associated carrier element, or it may be the same. A cavity may have a dot-like, an elongated or a more complex shape, for example.

In some embodiments, the at least one, optionally optical function of a utilized, potentially embedded, surface relief pattern comprising a number of surface relief forms may include a function selected from the group of: light directing function, light trapping function, reflective function, transmissive function, transreflective function, coupling function, incoupling function, outcoupling function, polarizing function, diffractive function, refractive function, anti-glare function, anti-clear function, anti-reflection function, collimating function, pre-collimation function, lens function, converging function, diverging function, wavelength modifying function, scattering function, coloring function, medium distribution function, and diffusing function. In the case of embedded patterns one or more functions may be achieved with the established related cavities at the element interfaces. The interfaces or predetermined portion thereof may be made optically transparent with e.g. proper selection of refractive indexes (same), if desired.

A plurality of surface relief forms of the pattern may bear the same function. Alternatively, different forms of the pattern may bear different functionalities. In one embodiment, a single form may provide several, at least two, functionalities. The same pattern or even a form may be configured to transmissively couple light and, on the other hand, reflect light, for instance. The functionality may depend on the nature, such as incident angle and/or wavelength, of light, and/or on the side of the form the light is incident on, for example. A surface relief form, either embedded or not, may be configured for a predetermined number of functions by properly selecting the associated material (contour material and fill material), dimensions, position and/or alignment, for instance.

In some embodiments, the laminate structure may include a third and optionally a number of subsequent carrier elements. These may include further surface relief patterns thereon. The surface relief patterns may be embedded within the laminate structure. Any of the first, second or optional further elements may be a laminate or other type of multi-layer and/or multi-portion element. A middle element may be thicker than the surrounding top and bottom elements such as films that may be provided with a number of surface relief patterns to be optionally embedded, for instance. Also the middle element may be provided with a surface relief pattern that is embedded within the laminate during the manufacturing of the laminate structure.

In some embodiments, the integrated laminate structure may comprise a plurality of layers of (originally) surface relief patters. Each laminated element, such as a film, foil or sheet, may comprise one or more surface relief patterns and construct one or more optically functional layers, respectively. Each layer may have a dedicated optical functionality or several functionalities. A multi-layer pattern may be formed by a single carrier element initially having a layer of surface relief forms on both sides thereof, and/or a plurality of carrier elements, each provided with at least one layer of surface relief forms, may be utilized to collectively form the multi-layer pattern. The layers of the multi-layer pattern may have at least one collective function.

In some embodiments, the first and/or second carrier element is substantially flexible and bendable. The degree of flexibility and bendability may differ embodiment-wise. For instance, a predetermined bend, e.g. 180 degrees, may be achieved with a predetermined bend radius without material breakage. Further carrier elements may be flexible and bendable as well. The laminate structure may be flexible and also bendable.

The carrier element may be thin such as a thin film. The thickness of a carrier element may also vary depending on the embodiment. It may be just a few nanometers up to several millimeters thick, for example. The above applies also to further carrier elements of the laminate structure. However, clearly thicker element(s) may be alternatively used.

In some embodiments, the first and/or second carrier element comprises plastic material such as polymer or elastomer, glass and/or ceramic material. Additionally or alternatively, other material(s) such as semiconductor materials, e.g. silicon or silicon wafer, may be used.

In some embodiments, a surface relief pattern to be optionally embedded comprises a number of surface relief forms defining at least one entity selected from the group consisting of: a grating, a grating groove, a binary shape, a slanted shape, a quadratic or rectangular shape, a triangular shape, a trapezoidal shape, a pixel, a grating pixel, a protrusion, a recess, a hollow, and a lens shape.

In some embodiments, the laminate structure may comprise or form at least part of a transmissive, reflective or transreflective element.

In some embodiments, the laminate structure contains or is provided with a functional surface layer such as a coating and/or a layer containing surface relief forms. These forms may indeed remain on the surface of the laminate structure. The function, or "property", thereof may include antireflection function, hydrophobic function, hydrophilic function, and/or self-cleaning function, for example.

In some embodiments, the laminate structure contains, establishes or is included in an indicative element and/or layer, or it is at least disposed on top of one. It may include an indicative surface such as an indicative sign, a poster or a plate. The indicative window or display may be passive. It may contain one or more symbols, numbers and/or letters. The shown data may be substantially informative, such as traffic signs, warning signs or register plates, and/or commercial such as advertising data by nature. Data indication may have been actualized using optionally embedded surface relief forms to establish, via cooperation with the light coupled therewith, the predetermined visual message, and/or by printing on the surface. The element and the data indicated therewith may be controllable by electronics, for example. The laminate may have e.g. a light-providing or -directing function in that scenario.

In some embodiments, a surface relief form and/or related pattern to be embedded in or be otherwise provided to the laminate structure may substantially be of submicron size regarding the length, depth/height and/or width thereof. Alternatively, the size of the form and/or pattern may be few microns or several tens of microns, e.g. about 20 or about 30 microns up to a number of millimeters. Even larger sizes may be applied.

In another aspect, a method for constructing an integrated structure for optical applications in the context of solar technology, wafer technology, cooling channels, greenhouse illumination, window illumination, street lighting, traffic lighting, traffic reflectors or security films, comprises obtaining a first carrier element, such as a piece of plastic or glass, preferably comprising optically substantially transparent material enabling light transmission therethrough, obtaining a second carrier element, such as a piece of plastic or glass, provided with at least one surface relief pattern comprising a number of surface relief forms and having at least one predetermined optical function relative to incident light, said second carrier element preferably comprising optically substantially transparent material enabling light transmission therethrough, laminating the first and second carrier elements together such that the at least one surface relief pattern is embedded within the established laminate structure.

Embedding the at least one surface relief pattern may practically cause a number of related cavities to be located substantially at the associated interface of the first and second carrier elements in the laminate. Portion of the cavity edges may be thus defined by the facing surface layer of the first carrier element.

In some embodiments, a roll-to-roll procedure is applied in the method. For instance, a roll-to-roll procedure such as roll-to-roll embossing or roll-to-roll imprinting may be applied for establishing the surface relief pattern on a carrier element. Alternatively or additionally, a surface relief pattern could be formed utilizing e.g. at least one technique selected from the group consisting of: embossing, imprinting, micromachining, UV embossing, UV imprinting, lithography, micro-molding, and casting. Yet, the lamination process may utilize roll-to-roll or planar processing technology.

In some embodiments, a carrier element, such as the second carrier element, is provided by at least one surface relief pattern such that a pre-master element, e.g. a pre-master plate comprising a pre-mastering pattern, is first formed utilizing a suitable technique such as electroforming, casting or molding, for example. A master element such as a nickel shim, plastic master plate, cast material plate, or a molded plate, may be formed based on the pre-master element.

Optionally, the pattern(s) of the pre-master element may be modulated by a suitable technique such as printing. Drop filling by inkjet device may be applied for modulation, for instance, such that ink-filled portions of the pre-master do not appear as such in the target element, i.e. the master element.

The previously presented considerations concerning the various embodiments of the laminate structure may be flexibly applied to the embodiments of the method mutatis mutandis and vice versa, as being appreciated by a skilled person.

The utility of the present invention generally arises from a plurality of issues depending on each particular embodiment. First of all, both simple and very complex high performance, integrated nano- or micro-scale structures with various functionalities, such as optical structures, fluidic structures (e.g. channels), cooling structures, or lubricant structures, may be embedded within a laminate structure comprising at least two elements defining at least two layers attached together. The utilized lamination technique may be preferably selected so that the attachment is secure and/or there substantially remain no (unintended) gaps between the laminated elements. Further integrated elements, layers or coatings may be provided on any side of the obtained laminate. In most embodiments, the laminate structure may be manufactured with a relatively simple and low cost industrial scale method. Yet, the embedded structures of the laminate remain protected from external impulses and contamination. Service life of the related products is extended and many of them may be practically maintenance-free.

Also multilevel/layer embedded structures may be easily constructed. Internal light-trapping structures utilizing e.g. specific geometries, refractive indexes and/or materials may be provided for internally reflecting light. Light capture layers effectively capturing and collimating light with a wide range of incident angles may be implemented. The laminate may be applied in connection with integrated electronics, semiconductors, (bio)medical systems, tribological systems, windows such as window lighting, solar cells, green house illumination, advertising, security applications, automotive and generally vehicle industry, street lighting, general lighting and various signs or plates such as traffic signs and luminous tags, for instance.

Particularly in the context of solar energy and especially solar cells (photovoltaic cells), improvements in the operation efficiency due to more efficient capturing of incident (surface) light to the solar cell, more efficient internal light trapping, and reduced if not completely eliminated contamination problems, may be achieved. The solar cell may remain static and implementing a moving means for adjusting the alignment thereof is unnecessary despite the increased efficiency. The laminate structure attached to the solar cell may be further provided with additional functionalities and layers such as self-cleaning nanostructures, coatings etc. Larger functional surfaces may be constructed. Rigid or flexible solar cell structures may be considered.

The expression "a number of" refers herein to any positive integer starting from one (1), e.g. to one, two, or three.

The expression "a plurality of" refers herein to any positive integer starting from two (2), e.g. to two, three, or four.

The expression "to comprise" is applied herein as an open limitation that neither requires nor excludes the existence of also unrecited features.

The terms "a" and "an" do not denote a limitation of quantity, but denote the presence of at least one of the referenced item.

Likewise, the terms "first" and "second" do not denote any order, quantity, or importance, but rather are used to distinguish one element from another.

The term "light" refers to electromagnetic radiation such as visible light but being not limited to visible light.

The term "carrier element" may generally refer herein to an element of the laminate that comprises predetermined material, such as material for carrying light, an element that comprises a predetermined functional element such as a coating or at least portion of a structure such as a surface relief pattern or a related cavity, and/or an element that supports, carries, protects or is at least fixed to other one or more elements in the finished laminate and therefore forms an integral part of the laminate.

Different embodiments of the present invention are disclosed in the dependent claims.

BRIEF DESCRIPTION OF THE RELATED DRAWINGS

Next the invention is described in more detail with reference to the appended drawings in which FIG. 1a illustrates various problems associated with contemporary solar cell arrangements.

DETAILED DESCRIPTION

Figure 1A:
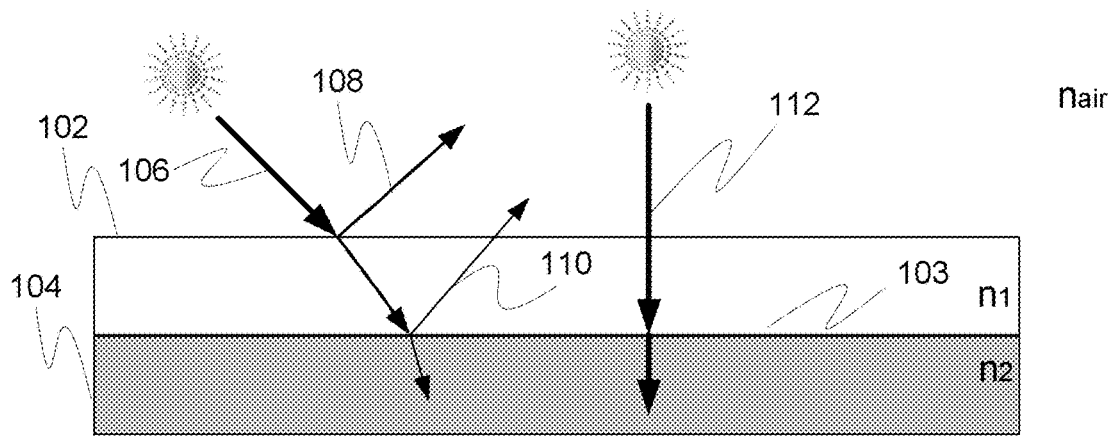
FIG. 1b illustrates various problems of surface relief structures when subjected to typical use conditions, e.g. outdoors.
Figure 1B:
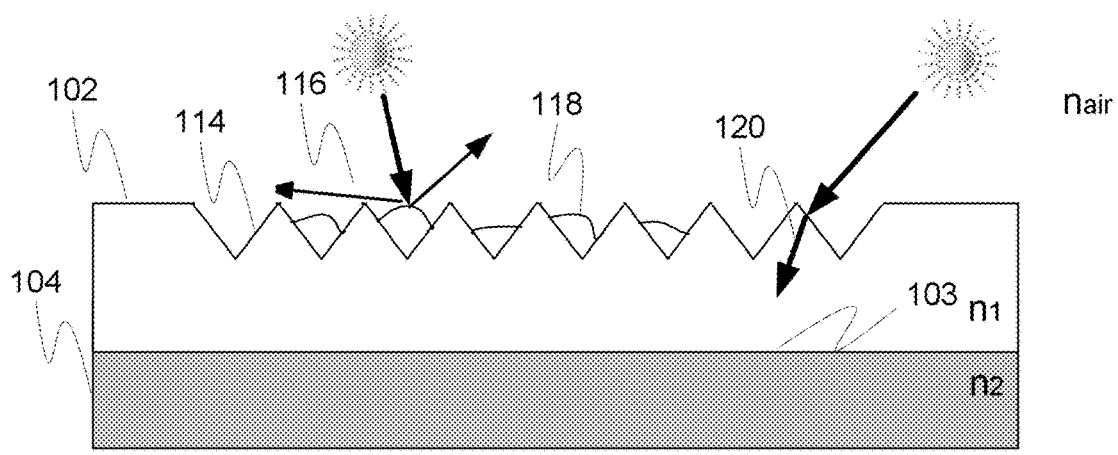

FIGS. 1a and 1b were already contemplated in conjunction with the description of background art.

The principles of present invention may be applied in various use scenarios and contexts. The context may relate to the utilization of visible, infrared and/or UV light, for instance.

In some embodiments of the present invention, the laminate structure may be produced from bulk elements such as bulk plates or films. These may be provided with optical patterns having desired optical functions such as coupling, e.g. incoupling or outcoupling, function. Patterns with small surface relief forms such as gratings, binary, blazed, slanted and/or trapezoidal forms may be utilized. Discrete patterns such as grating pixels, small recesses, or continuous forms, elongated recesses or channels, basically almost any kind of two or three dimensional forms, may be utilized. Preferably there are at least small flat portions, i.e. contact surfaces, on the laminate junction areas (interfaces) to enhance adhesion of the associate laminate layers and/or to obtain desired light propagation and/or other behavior.

The embedded surface relief pattern may form and be considered to include a number of closed cavities such as micro-cavities filled with air or other medium on the junction area. Also a number of larger structures such as refractive structures may be established. Accordingly, the cavities are preferably optically functional and have at least one predetermined optical function. Thus, when designing a surface relief form/pattern to be embedded, one shall naturally contemplate the functionality of the form/pattern as embedded in the laminate such that the surrounding laminate materials, shapes and forms, established cavities at the interfaces, etc. are properly taken into account as to their e.g. optical effect.

In some embodiments, the outmost laminate element such as the top or bottom laminate element, when in use, may contain integral light coupling optics such as incoupling optics, outcoupling optics and/or polarization gratings such as wire grid or other grating solutions. The optics may include embedded optics and/or surface optics.

In some embodiments, a number of light sources may be functionally and/or physically connected to the laminate structure, via edge for example, using suitable optionally laminate- and/or light source-integrated coupling optics such as collimation and/or reflective optics. Bottom coupling is a further possibility.

In some embodiments, a multilayer such as dual-layer optic structure is implemented by the laminate for coupling or other purposes. A layer or other element of the laminate may be configured for certain wavelength of light such as a certain range of wavelengths. Another layer may be configured for other wavelengths. For instance, a surface layer or a layer closer to the surface may be configured for IR (longer wavelength) and another layer residing deeper in the structure for visible light (shorter wavelength), or vice versa. The layer thicknesses may be selected on target wavelength basis. With proper thicknesses, desired layers may be made practically invisible from the standpoint of desired wavelengths. The laminate may incorporate coupling optics, e.g. coupling layers with surface relief patterns, on multiple sides thereof.

In some embodiments, the laminate structure may be applied in advertising and indicative windows, displays, signs or marks. An optically functional element, such as a plate or film, which may be a laminate, may be disposed on top of a target picture or other target element as a separate element or integrated therewith (laminated, for instance). It may contain a surface relief pattern optionally located closer to the picture or the other target element than the opposite surface to enhance contrast. A binary grating or other patterns may be utilized e.g. with a panel element. Binary grating may be desired for larger viewing angle applications and a blazed grating for narrower viewing angle. Hybrid grating solutions are possible as well. Diffusing optics may be utilized for hot spot avoidance and for more uniform illumination. The solution is also applicable to UI solutions and license plates for instance. With license plates or other elements with identification or other visual data provided thereon, the indicated numbers, letters, etc. may be laminated into contact with a front plate to make number/letter surroundings illuminated, for example, for improved contrast.

In various embodiments of the present invention, one or more elements of the laminate structure may be substantially optically transparent, translucent or opaque. The required degree of transparency of each element naturally depends on each particular use case. For example, in some embodiments the preferred transmittance in relation to predetermined wavelengths of light (e.g. infrared, visible or uv) may reside within the range of about 80 to 95%, for instance, for a material considered as substantially optically transparent in that context.

Figure 2:
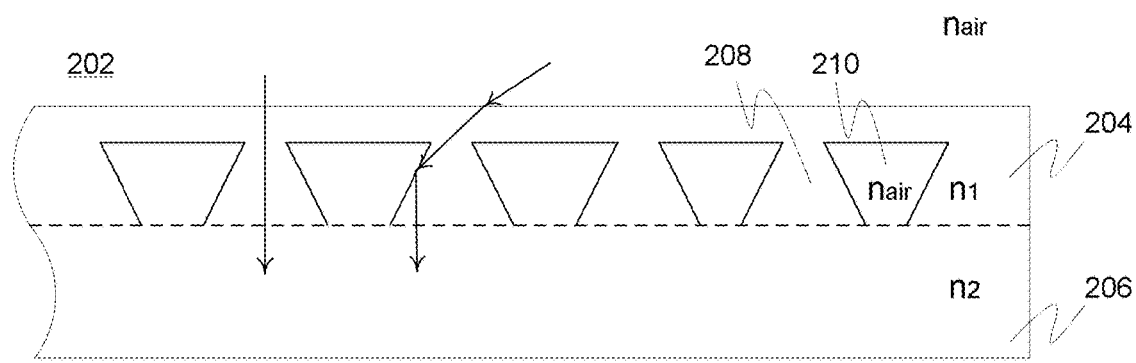
FIG. 2 is a cross-sectional illustration of an embodiment of the laminate structure in accordance with the present invention.

Reverting to the figures, FIG. 2 depicts one scenario wherein an embodiment of the present invention may be applied. The integrated laminate structure 202 comprises two planar carrier elements 204 and 206 laminated together. More elements could be added, if needed. The broken line denotes the (ex-)interface between the two laminated elements 204 (hereinafter "top element" due to the location in the figure; in actual use scenarios the physical positioning of the elements in top/outer vs. bottom/inner scale may be the same or e.g. opposite), 206 (hereinafter "bottom element" for the corresponding reason) in the figure. The interface may be optically transparent as described hereinbefore. Few light rays are visualized as solid line arrows in the figure.

The top element 204 has been originally provided with a surface relief pattern comprising a number of protruding surface relief forms 208 on the bottom thereof with corresponding recesses 210 in between. The top element 204 and bottom element 206, which may be considered as a substrate carrier of the top element 204 and a partial substrate for the created cavities defining at least a portion of the walls thereof at the interface of the elements 204, 206, have been then laminated together so that the protrusions 208 of the surface relief pattern extending downwards with the shape of e.g. a truncated cone (note cross-sectional form of an isosceles trapezoid in the figure) have contacted the alignment-wise corresponding surface portions of the bottom element 206 having a substantially flat contact surface in the illustrated case. Thereupon, the recesses 210 have formed cavities potentially including material such as air trapped therein unless a vacuum has been provided. The material may thus have a refractive index different from the surrounding material. If the material of the element 204 is plastic, its refractive index is generally higher than the refractive index of air, for instance.

Regarding the use of different materials or refractive indexes in general, when multiple elements such as material layers bear the same index, these may be regarded as a single element by light, thus defining an optically transparent interface. On the contrary, different materials with unequal indexes may be utilized in order to modify light management, e.g. total internal reflectivity, as desired.

The utilized shapes and/or refractive indexes nair, n1, n2 of the materials carried by the elements 204, 206 may have been selected so as to provide a desired functional effect in terms of light propagation. It is illustrated in the figure by the arrows how a number of light rays with different incident angles may be collimated by the applied configuration of laminate layers and surface relief pattern therein to advance towards the bottom of the laminate in substantially perpendicular fashion. Thus the top element 204 may be considered to act as a light capture layer for the underlying one or more elements 206. In some embodiments, the element 204 may be thin, essentially a film, with only e.g. few nanometers thickness, whereas in some other embodiments it may be several millimeters thick or even considerably thicker. The same considerations apply to the bottom layer 206. The shown or a similar embodiment could be applied in the context of window illumination or solar cells, for instance.

Figure 3:
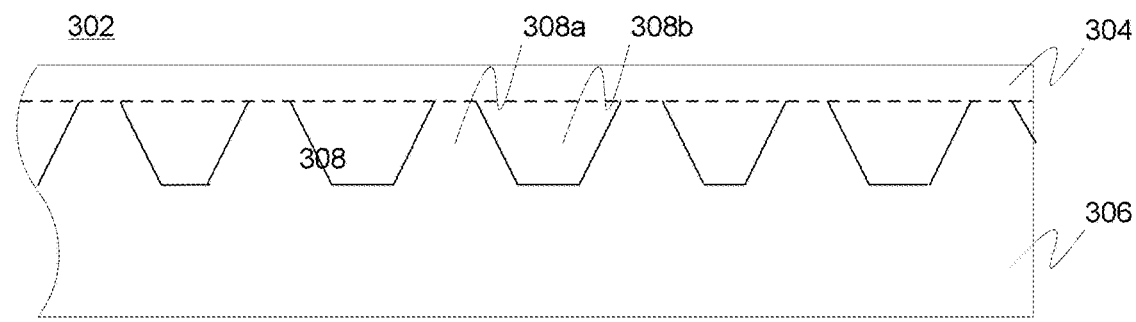
FIG. 3 is a cross-sectional illustration of another embodiment of the laminate structure in accordance with the present invention.

FIG. 3 discloses another embodiment 302 with two carrier elements 304, 306. In this embodiment, the bottom element 306 contains a surface relief pattern 308 with protrusion 308a and intermediate recess 308b forms, or "profiles", on top of which a flat top element 304 has been laminated. Again, the established cavities may contain air and/or some other material(s).

Figure 4:
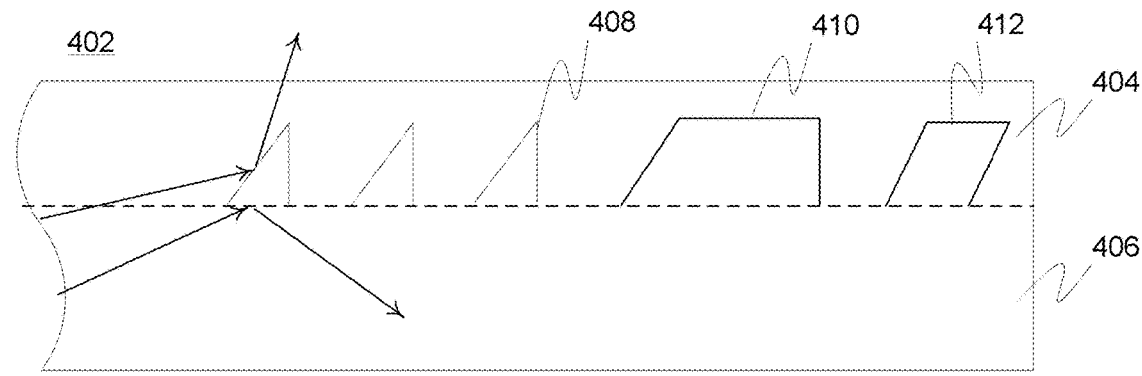
FIG. 4 is a cross-sectional illustration of a further embodiment of the laminate structure in accordance with the present invention.

FIG. 4 discloses an embodiment 402 in which a plurality of different embedded surface relief forms is configured to form a number of embedded surface relief patterns relative to elements 404, 406 laminated together. Triangular 408, trapezoidal 410 and slanted (rectangle or square) 412 forms are shown in the figure. For example, the forms and related patterns may have been configured for outcoupling and/or other type of light redirecting as visualized in the figure by the arrows. Forms of different shape and/or material may be configured so as to provide a common, collective optical function, or they may be utilized for different purposes. A certain embedded surface relief form may have multiple uses depending on e.g. the incident angle and/or face of light. For example, in the figure the leftmost triangle form or cavity has both outcoupling and light trapping functionalities, which has been visualized by the two rays. The established cavities may contain air and/or some other material(s). The laminate structure 402 may be disposed on top of and optionally laminated with other element(s) such as an indicative element such as a poster, sign or plate, or with a window, for example. Alternatively, the indicative or other element may be included in the element 406.

Figure 5:
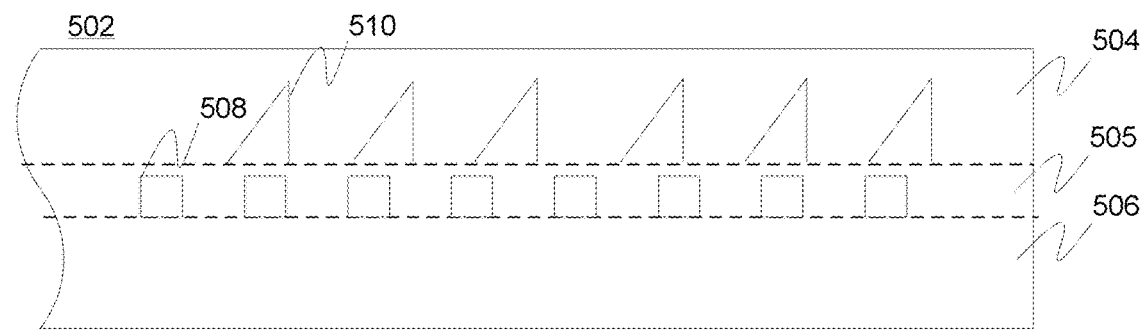
FIG. 5 is a cross-sectional illustration of a further embodiment of the laminate structure in accordance with the present invention.

FIG. 5 illustrates a further embodiment 502 wherein three carrier elements 504, 505, 506 have been laminated together. Each of the elements 504, 505, 506 may contain a number of surface relief patterns and/or other features, but in the illustrated extract the bottom element 506 is free from them and merely acts as substrate for the upper elements 504, 505. The bottom element 506 may, in some use cases, contain and/or exhibit e.g. indicative data (advertisement data, informative data). It may be a sign or plate with indicative data printed or otherwise constructed thereon, for instance.

The middle element 505 comprises a surface relief pattern of substantially rectangular (binary) forms 508, which may (being not visible in the cross-sectional figure) be dot or pixel like forms or longer grooves such as grating grooves or corresponding protrusions. The top element 504 comprises a pattern of triangular forms 510. The top element 504 may form in the laminate at least one optically functional layer the embedded surface relief pattern of which has at least one predetermined function such as incoupling or outcoupling function. The middle element 505 may form at least one other optically functional layer the embedded surface relief pattern of which has potentially other predetermined function such as reflective function. Again, a number of different forms and/or layers of microstructures may be configured regarding a common functionality from the standpoint of a desired functionality such as predetermined light incoupling or outcoupling property such as collimation or decollimation property. The cavities established by embedded surface relief forms may contain air and/or some other material(s).

Figure 6:
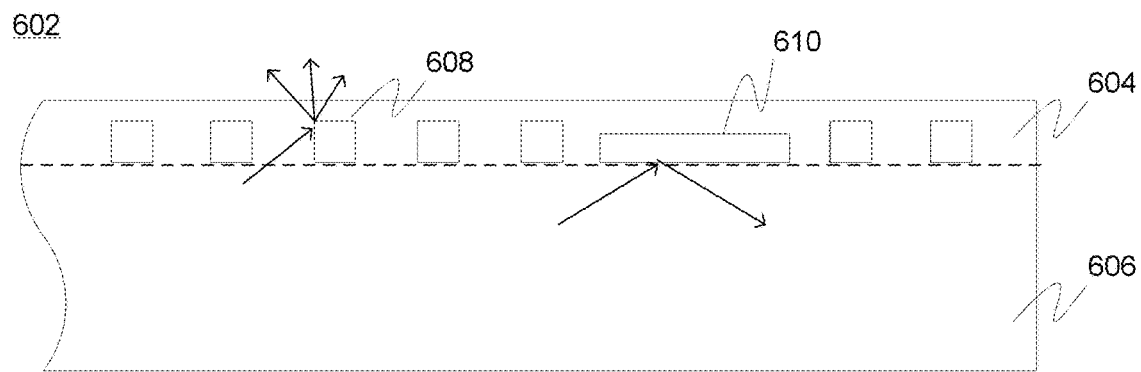
FIG. 6 is a cross-sectional illustration of a further embodiment of the laminate structure in accordance with the present invention.

FIG. 6 discloses a further embodiment 602 wherein the top element 604 of the laminate comprises at least one pattern comprising a number of first, essentially square-shaped, surface relief forms 608 and second, essentially rectangular, surface relief forms 610 on the surface facing the bottom element 606 in the laminate structure. The forms may have similar or different purposes. For example, the first forms 608 may be configured in terms of the utilized material(s), dimensions and/or positioning, for functions such as outcoupling or incoupling whereas the second forms 610 are for reflection, potentially specular reflection.

Figure 7:
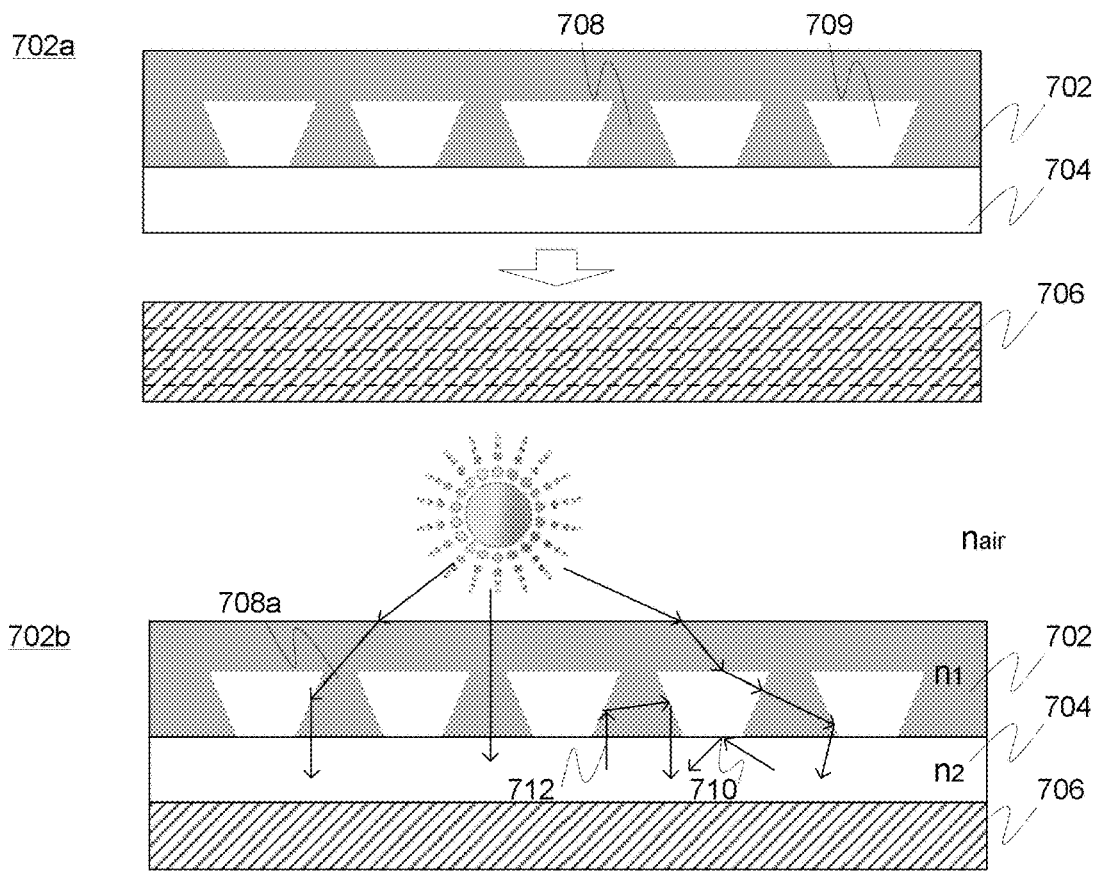
FIG. 7 is a cross-sectional illustration of a laminate structure for a solar cell in accordance with an embodiment of the present invention.

FIG. 7 illustrates a further embodiment especially suitable for the context of solar energy production, i.e. solar power, and solar cells. A carrier element such as a thin film element 702 (the depicted thicknesses and other dimensions are generally not in scale for clarity purposes) potentially configured to act as a light capture element may be provided with a surface relief pattern comprising a plurality of surface relief forms 708 capable of collimating light (with a narrower distribution) in the laminate structure towards predetermined direction, substantially the direction of the underlying components of the solar cell 706 from a wider range of incident angles of external light, typically sunlight, penetrated through the surface of the element 702 and incident on the pattern. The height/depth of the surface relief forms 708 of the pattern may be about 10 µm, for instance.

The film element 702 and a carrier element 704 that may also act as the cover plastic or glass of the solar cell structure (indeed, often the solar cells are provided with integral cover glass) may be first laminated together and stored and delivered for later joining with the rest 706 of the complete solar cell structure as suggested herein, for example. This is highlighted at 702a of the figure wherein the vertical arrow depicts the fact how the already laminated film element 702 and cover glass 704 are to be joined with the solar cell stack 706 typically comprising a plurality of different layers and related elements illustrated in the figure by a plurality of horizontal lines. For example, the solar cell structure 706 potentially stacked below the cover glass 704, which preferably contains tempered glass, may incorporate one or more layers or elements selected from the group consisting of: a back contact, a p type semiconductor, an n type semiconductor, a front contact, transparent adhesive, and anti-reflective coating.

At 702b, a use situation after completing the manufacturing of the overall solar cell structure comprising also the film element 702 for light capturing as an integral part is shown. Alternatively, the film element 702 may be provided as such onto the solar cell structure having the front glass 704 already in place. As a further alternative or supplementary option, the element 702 may be provided between the glass 704 and the rest of the solar cell structure 706. Still as a further example, the glass 704 may be provided with a surface relief pattern. The established cavities 709 may contain air and/or some other material(s) left or specifically disposed therein during the manufacturing process of the laminate structure.

Generally, the described nano- and microcavity film techniques can be utilized in different layers of a solar cell product 702b. E.g. complex undercut profiles are possible. Also multi-layers with multi-profiles are suitable as contemplated hereinbefore. An optically functional layer can be produced/applied on the top surface, some internal surface (e.g. to the middle under the glass plate) or directly on the silicon surface/solar cell surface including possible nanoprofile in the silicon/photovoltaic surface to improve light absorption. The optical profiles are preferably fully integrated.

The arrows depict in the figure how the suggested construction may enhance the efficiency of the solar cell in a variety of ways. In addition to or instead of incident light coupling and/or directing (e.g. collimation) function 708a, reflective and generally "light-trapping" functions 710, 712 may be achieved by the utilized patterns including cavities, their positioning, alignment and material selections. The light traps may be thus formed without true, reflective mirror surfaces in the carrier material.

The solar cell structure suggested herein may provide about 20-40% higher efficiency than the conventional solutions, whereupon the overall efficiency may approach e.g. 40% or 50%. Both rigid and flexible solar cell materials and structures may be applied and constructed.

Figure 8:
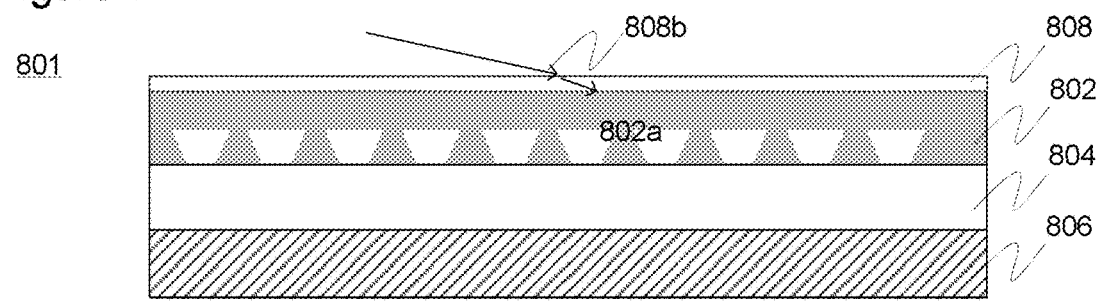
FIG. 8 is a cross-sectional illustration of a laminate structure for incoupling purposes in accordance with an embodiment the present invention.

FIG. 8 visualizes an embodiment 801 wherein the light capture film or plate element 802 laminated on the glass 804 protecting the rest 806 of the solar cell has been further provided with a functional surface layer 808 implemented by a specific film, a coating, a surface relief pattern, or any combination of the above and/or other elements, for instance.

For example, a number of anti-reflective (AR) and/or self-cleaning (nano)profiles may be utilized to minimize surface reflection and contamination. The AR functionality may preferably enable incoupling sunlight even with very large incident angles relative to the structure surface (normal), such as angles of about 70 or 80 degrees, into the structure from the atmosphere so that the solar cell receives as much light as possible and the efficiency thereof may be maximized. This is indicated in the figure by the arrows 808b. The embedded surface relief pattern 802a of element 802 may be then utilized to direct and collimate the incoupled light towards the solar cell 806. The pattern 802a may also be designed so as to be capable of coupling a considerable range of incident angles, e.g. a total range of 120, 130, 140, 150 or 160 degrees, as desired.

For example, the pattern 802a may be configured to couple incident light such as sunlight having entered the structure so that the incident angles properly coupled optionally defining a range of at least about 120, 130, 140, 150 or 160 degrees, and wherein the pattern is configured to couple the incident light with a collimation function substantially towards a predetermined direction of a solar cell.

Also integrated reflectors with micro-cavities may be adopted for solar cell structures, which may improve maintaining the sunlight longer inside the structure, whereupon energy absorption can be potentially improved. Accordingly, the suggested laminate structure may in some embodiments improve the efficiency of the solar cell considerably.

It shall be mentioned that in some embodiments the constructed overall solar cell structure including the light capturing or other laminated element may contain multiple, e.g. two, functional, such as anti-reflective, layers. One may be disposed on either side of the cover glass and the other on the other side in connection with the light capture film element such that it preferably receives the external, incident light prior to the light capture film element.

The principal ideas presented hereinbefore relative to a solar cell coupling film or other element with a large incidence angle collimation are generally applicable to other scenarios as well including e.g. greenhouse related embodiments. These kinds of films may increase the use of sun light without extra mirrors, for instance. The transparency of the film may be enhanced by means of minimized pattern features relative e.g. to the size thereof.

In some embodiments, the principles described herein may be capitalized in the context of windows or displays. The windows/displays may be used for advertizing, safety or security purposes, for example.

In some embodiments, a number of embedded reflectors such as nanoreflectors may be manufactured by the techniques presented herein. Small patterns, e.g. grating based reflecting profiles can be laminated directly on e.g. a planar reflector and those small surface relief patterns of laminated elements may be completely embedded, unlike e.g. with conventional retroreflector films.

In some embodiments, a polarizer may be manufactured in accordance with the principles set forth herein. E.g. a grating/wire grid polarizer may be produced optionally by a roll-to-roll method. Basic profiles may be manufactured by applying UV curing and related curable material, for example, after which deposition coating by higher refractive index by means of laser assisted deposition may be executed on the line. The laser may be used to deposit many different materials. Also orientated directional deposition (on-side deposition, asymmetric deposition) is possible. A grating profile may be binary, slanted, quadrate, etc. with different slanted surfaces, etc.

In some embodiments, a number of features of the present invention may be utilized in connection with light incoupling and related solutions. Nowadays, e.g. LED light incoupling and collimation for a typically planar element is a critical issue. A flat ball lens bar optionally in a row form is a unique solution. It could contain 2D or 3D surface depending on the collimation axis. Principally, one axis collimation may be enough. Such an optical solution may be produced separately or together with the planar element. Possible manufacturing methods include injection molding, casting, laser cutting, etc. It is possible to use mirror surface on the top and bottom for the light direction control. Also special grating orientating patterns on the edge and/or e.g. top may provide desired solutions. A wedge type of collimation with air medium is a further feasible option.

Figure 9A:
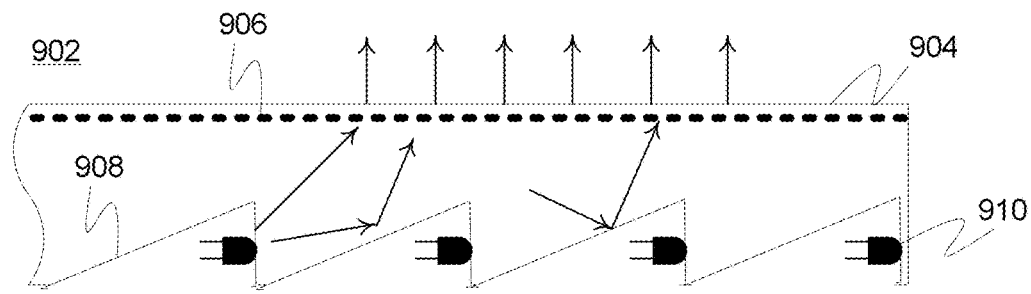
FIG. 9a is a cross-sectional illustration of a structure for incoupling purposes in accordance with an embodiment of the present invention.

FIG. 9a illustrates one embodiment for incoupling purposes. The incoupling element 902 includes a number of potentially embedded (e.g. a laminated film) reflector forms 908 and a potentially embedded (e.g. laminated film) light directing structure 906 that may be provided as a laminated layer/element on a predetermined surface of the carrier material 904 such as plastic or glass. In the illustrated case, a plurality of LEDs 910 is applied as light sources.

Figure 9B:
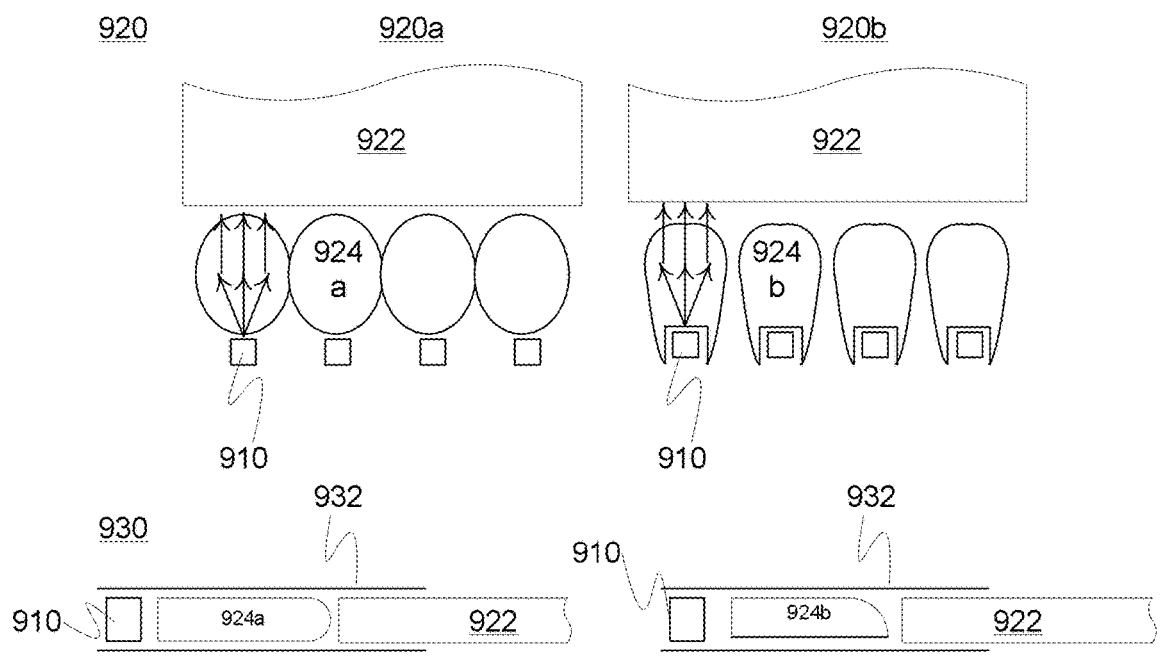
FIG. 9b is a cross-sectional illustration of two other embodiments for incoupling purposes in accordance with the present invention.

FIG. 9b illustrates further embodiments relating to the incoupling structures. At 920, on the left 920a, top/bottom view of one embodiment is shown with a plurality of light sources such as LEDs 910, incoupling forms such as lens forms 924a and a target element 922. The shown lens forms are basically circular or ellipsoidal. On the right at 920b, other embodiment with different incoupling forms such as lens forms 924b is presented.

At 930, potential, corresponding side views are shown with additional, preferably integrated, reflector elements 932. Lens shapes 924a, 924b are apparent in the figure.

Thus in various embodiments of the present invention, a laminated lens element such as lens film may be utilized to form nano-/microcavity coupling structures. Embossed/imprinted films can be laminated on a carrier material/film. This makes possible to produce new lens structures with multi layer patterns. Another benefit is that optical patterns are completely integrated/embedded and those can't be defected or destroyed easily. There are several feasible applications such as street lamps, halogen replacements, etc.

Another potential illumination lens is a non-direct transmission element, which couples light e.g. from the air medium and directs it to preferred angles. One surface may have a reflector (2D or 3D) and the other a surface coupling pattern (2D or 3D).

A light source, such as LED, bar may be collimated at least in 2D horizontal direction. This may make coupling pattern more simple and efficient. The solution may have applications in e.g. street lights, public illumination, etc.

Another application is a light bar, rod or tube, in which the coupling structure or film forms or is in the outer or inner surface thereof for coupling and directing the light. In the tube solution a reflector rod may be utilized in the center (inner part). A coupling film may also be laminated in the glass to direct the light to preferred angles (inside or outside).

One additional benefit with surface relief-based, optionally embedded, lenses such as grating lenses is efficiency, which is better than with conventional Fresnel lens, for example, due to e.g. smaller features having much less back reflection than conventional larger patterns, and also to the possible (bottom) location of the patterns. When those patterns are on the bottom side of the overall structure, there is not so much direct back reflection, because medium carrier is on the top side.

This may be a benefit for e.g. traffic signs due to the lower sun phantom effect (back reflection). Additionally, the solution is suitable for e.g. brake and signal lights in vehicles.

Figure 10:
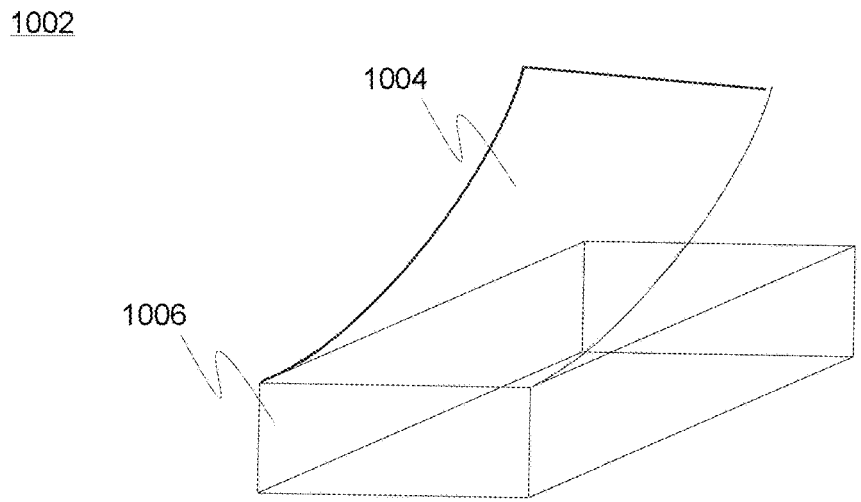
FIG. 10 illustrates manufacturing an embodiment of the laminate structure in accordance with a present invention.

FIG. 10 illustrates a laminate structure 1002 comprising a plurality of elements 1004, 1006 in accordance with an embodiment of the present invention. A number of embedded, integrated functionalities may be provided to the laminate 1002 by adding new elements such as functional carrier films 1004 with surface relief patterns and/or particular material (e.g. in terms of refractive index) thereto. Surface relief patterns may be established directly on the target surfaces. Curable materials such as lacquer may be utilized. Basically the necessary coupling and/or other optics may be laminated as a film or a thicker element to the carrier entity thereof. Roll-to-roll processing techniques are possible and often preferred naturally still depending on the embodiment and the nature such as flexibility and thickness of the applied elements.

Figure 11:
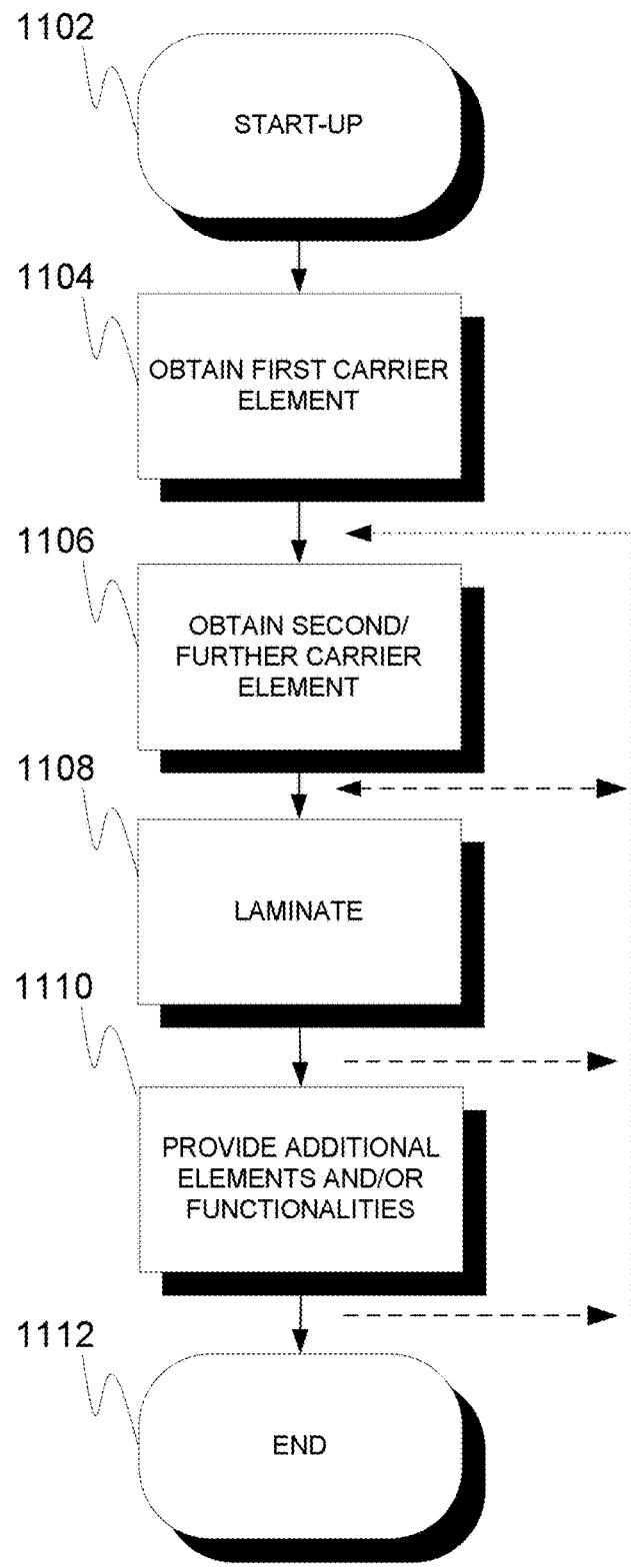
FIG. 11 is a flow diagram disclosing an embodiment of the method of manufacture in accordance with the present invention.

FIG. 11 discloses, by way of example only, a flow diagram of a method of manufacture in accordance with the present invention.

At start-up 1102 the necessary equipment such as embossing/imprinting gear, molding gear, casting gear, lamination gear, curing gear and/or roll-to-roll gear is obtained and configured. Yet, source materials for laminate layers and the lamination itself, such as necessary adhesives, if any, are obtained.

At 1104, a first carrier element defining at least one layer of the integrated laminate structure is obtained. The first element may be provided with desired surface relief patterns and coatings. Curable material such as lacquer may be provided, embossed or otherwise processed to contain a surface relief pattern and cured, for example. The element may be molded or cut to desired dimensions from a larger piece of source material such as plastic or glass. It may be subjected to a number of treatments and/or provided with adhesive for lamination purposes. Optionally, the first element is a multilayer element such as a laminate element itself. It may be contain e.g. a plurality of solar cell-constituting layers and/or elements.

At 1106, a second carrier element to be utilized in the integrated laminate structure is obtained. It contains a number of surface relief patterns that may be fabricated, as the ones of the first element, with different methods, such as roll-to-roll embossing/imprinting, lithography, micro-molding, casting etc. on the surface thereof. It may contain plastic, glass or ceramic material, for example. Suitable curing may be applied. Further, desired additional elements and/or coatings may be provided to the second element. The second element may be a multilayer element such as a laminate element.

In conjunction with the present invention, a surface relief pattern may be produced by means of pre-master pattern, master pattern and related elements. A pre-master element with a pre-mastering pattern may be first created by micro machining, lithography, imprinting, embossing and/or by some other method. This pre-mastering pattern may be then replicated by electroforming, casting or molding. Then formed nickel shim, a plastic master plate, a cast material plate, a molded plate may contain plurality of micro relief pattern on the surface, preferably small grooves, recesses, dots, pixels, etc.

The preferably negative relief patterns of the pre-master are advantageously suitable for the inkjet and/or printing modulation process. This modulation process may be based on a profile filling method, in which the existing groove, recess, dot, pixel, etc. is potentially completely filled with inkjet/printed material. This material is dispensed by forming small pico-drops in order to fill and "hide" the existing patterns. Method is suitable to complete a filling factor modulation on the surface of the target element, i.e. the master. Naturally the method is suitable for many other applications as well, and not only to filling factors. It's suitable also to design different discrete figures, icons, forms and shapes, for example. This makes it possible to create low cost optical designing process, which is fast, flexible and first of all, easy to utilize. A skilled person will realize that the profile filling method suggested herein is generally feasible also in other contexts than merely the laminate context of the present application.

The fill material such as ink could be transparent and optically clear, which has preferable the same refractive index than the plate material. This way it is possible to make real functional tests and trials. But e.g. colored ink is also possible, but then replication process may be needed in order to obtain a functional, optical test part.

One issue to consider may be the drop size and material viscosity. This might be important in terms of controlled and high quality filling. If the viscosity is too low, the drop will flow for large area and it goes along the groove bottom. Thus completely filled structure is getting more difficult to achieve. If the viscosity is high, the drop size is getting bigger, but the form is more compact and doesn't flow on the groove too much. A preferred solution may therefore include low viscous material, which guarantees small drop size. And if utilizing only a small pattern, discrete grooves, recesses, dots or pixels, the drop advantageously fills only preferred patterns in the desired location. Thus the pre-master may be preferably patterned with small pixels or discrete profiles.

At 1108, the first and second elements, and optionally further elements, are laminated together utilizing suitable pressure, heat and optionally adhesive(s) between the elements to be laminated together. Feasible curing may be applied. The embedded surface relief profiles basically establish associated micro- and/or nanocavity patterns. Potentially very complicated volumes (e.g. cavities) may be created, which is difficult if not impossible by other methods. Multilevel/multilayer patterns are possible by laminating several patterned medium carriers (elements) together. An element to be included in the laminate may comprise a surface relief pattern on multiple sides thereof. Different patterns can provide different functionalities in the laminate.

One realization implies laminating e.g. UV embossed/imprinted thin films (patterned films) on a thicker carrier such as plastic or glass plate and then executing the final curing in order to obtain good adhesion between laminated film and plate. Roll-to-roll lamination is possible provided that the laminated elements are suitable, i.e. thin/flexible enough, for the purpose.

At 1110 further elements and/or functionalities may be provided to the laminate. Post-processing actions such as cutting, excess material removal, (re-)reeling, testing etc. may be performed.

The method execution is ended at 1112.

The mutual ordering and overall presence of the method items of the method diagrams disclosed above may be altered by a skilled person based on the requirements set by each particular use scenario. Execution of some method items may be alternately repeated during the method as illustrated by the broken arrows.

Figure 12:
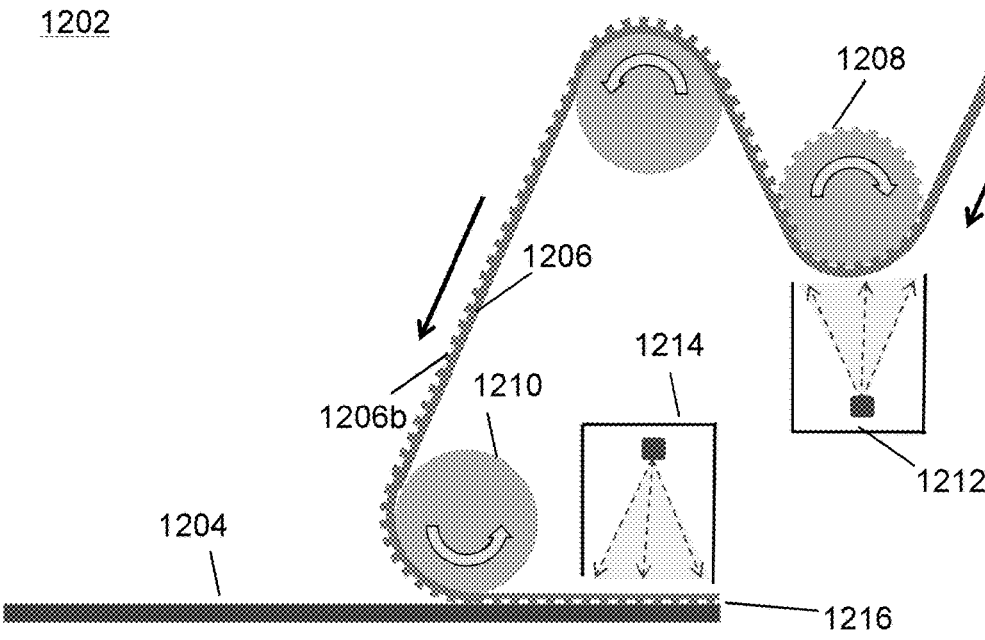
FIG. 12 illustrates various aspects of potential roll-to-roll manufacturing scenarios.

FIG. 12 illustrates various aspects of possible roll-to-roll manufacturing scenarios applicable in connection with the present invention. In the shown sketch, two elements, basically films, sheets or foils, 1204, 1206, are laminated together and a surface relief pattern 1206b is replicated by the cylinder/roll 1208 to the element 1206 during the process prior to the lamination. The laminate structure 1216 is formed and the pattern 1206b is laminated within the structure 1216 by the lamination cylinder/roll 1210. Pre-curing 1212 such as UV light curing may take place as well as post-curing 1214, optionally again UV curing. A number of further process actions such as cutting, reeling and testing actions may be implemented (not shown in the figure). A target element such as element 1204 could also be provided with multiple additional layers such as films optionally on both sides thereof. This might be implemented in one go, if the amount and nature of necessary hardware such as cylinders/rolls etc. is sufficient. Alternatively, the same result could be obtained via multiple runs during which e.g. a single layer is added to the laminate per round.

Figure 13:
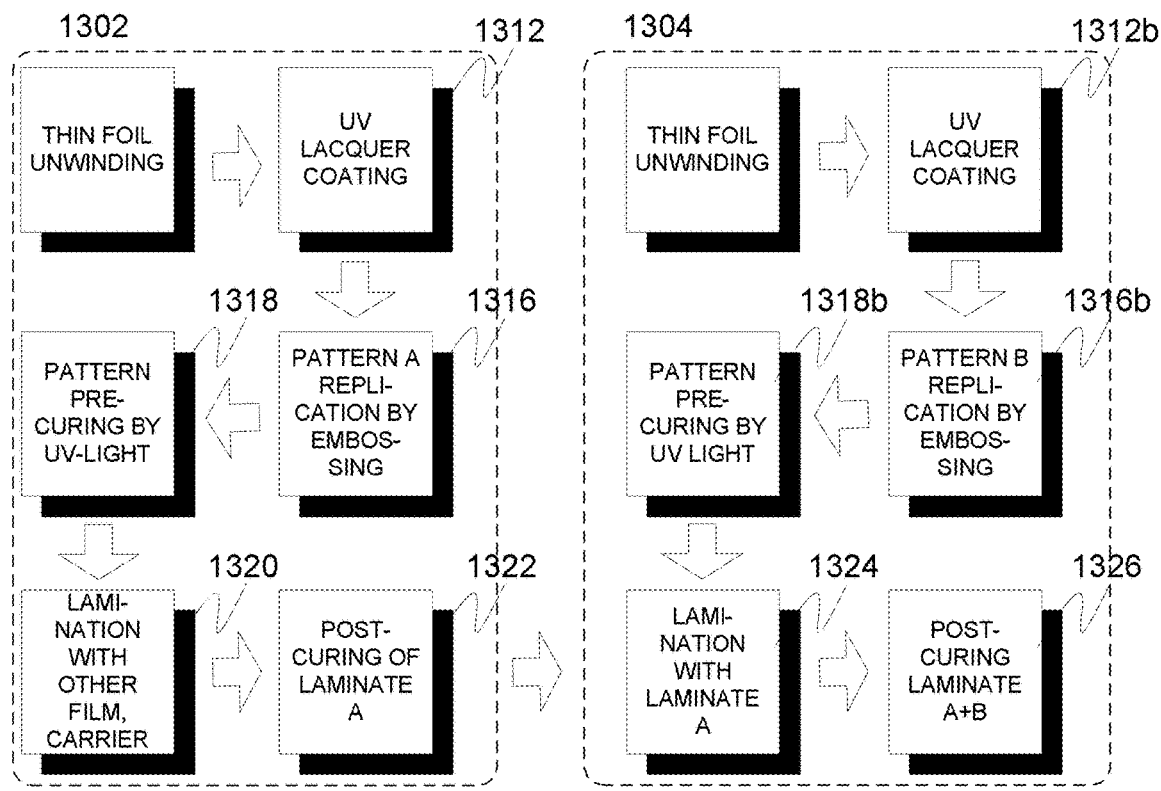
FIG. 13 illustrates selected elements of a manufacturing process resulting in a creation of an embodiment of the laminate structure in accordance with the present invention.

FIG. 13 illustrates different potential items of a further embodiment of a preferably roll-to-roll based manufacturing method in accordance with the present invention. The particular example is about foil lamination, but a skilled person will realize the principles apply to various other carrier elements to be laminated as well. At 1302, it is generally shown how a functional such as an optically functional element may be provided to a carrier material such as a film. As alluded in the figure, a foil, film or other type of element may be first provided 1312 with material such as lacquer that enables forming surface relief forms therein and is curable. The material hosting the surface relief pattern may indeed be thermally curable, UV curable, moisture curable, or e-beam curable, for instance, among other options. Additionally, combined curing techniques utilizing at least two curing methods such as UV curing+thermal curing, UV curing+moisture curing, thermal curing+e-beam curing, etc. may be applicable depending on the used materials.

After establishing 1316 a surface relief pattern "A" on the lacquer-provided foil by embossing or some other technique, the pattern may be, when needed, pre-cured 1318 by a suitable method such as UV curing potentially followed by lamination 1320 relative to a carrier element such as another film. The established laminate "A" including the pattern A preferably as embedded may be cured at 1322 after which it a further functional element such as foil may be coupled, preferably by lamination 1324, thereto, which is generally shown, by way of example only, at 1304 with substantially similar process items indicated by identical reference numerals supplemented by 'b', however. Nevertheless, these process items do not have to be similar and e.g. different pattern formation technique and/or curing technology could be applied. The further functional element may include a pattern "B" as indicated in the figure. The final laminate comprising both patterns A and B may be subjected to a number of applicable curing 1326 procedures and/or other treatments.

Consequently, a skilled person may, on the basis of this disclosure and general knowledge, apply the provided teachings in order to implement the scope of the present invention as defined by the appended claims in each particular use case with necessary modifications, deletions, and additions, if any.

For example, in some embodiments, one or more elements of the integrated laminate structure may contain the explained cavity optics for predetermined purpose such as uniform illumination or discrete illumination. The optically functional elements may be integrated by lamination with other elements such as covers of various electronic or other devices.

The present invention enables providing localized optical functions within integrated structures such as laminates. Local effects and visual indications, such as informative indications, may be created in certain embodiments thereof.

Generally in different embodiments of the present invention the relief forms may be positive or negative relative to the associated surface level of the carrier substrate.

In some embodiments, instead of or in addition to lamination, the elements of the integrated structure may be attached using some other methods such as mechanical fastening structures, mere adhesives, etc.

In some embodiments, a laminate structure according to the present invention may be further integrated with or configured to contain other elements such as chips, chip packages, solar cell structures, light sources, lighting elements, electronics, cover or body structures, etc.

Each of the afore-explained various functions/functionalities may be implemented in the laminate structure by a dedicated element, a shared element or by a plurality of cooperating elements.

Instead of or in addition to optics, the laminate solution presented herein could be utilized in other contexts such as microfluidics. E.g. cooling structures and cooling channels could be manufactured therewith. Also lubricant channels could be formed.

The invention claimed is:

1. An integrated laminate structure adapted for optical applications related to wafer technology, cooling channels, greenhouse illumination, window illumination, display illumination, street lighting, traffic lighting, lighting element, traffic reflectors or security films, comprising:
    a first carrier element, configured as an entirely flat, planar element,
    a second carrier element, configured as a planar element, in which an at least one recessed surface relief pattern is formed having flat surface areas between the recesses,
    said first carrier element and said second carrier element being composed of an optically substantially transparent material enabling light transmission therethrough,
    the first carrier element and the second carrier element being laminated together to establish the integrated laminate structure such that the at least one recessed surface relief pattern has been embedded within the established integrated laminate structure, whereby an embedded relief pattern is formed at a flat interface between the entirely flat, planar first carrier element and flat surface areas of the second carrier element,
    wherein said embedded relief pattern is configured to perform an at least one predetermined optical function relative to incident light,
    wherein the embedded relief pattern formed at the flat interface between the first and the second carrier elements comprises a number of related, optically functional cavities,
    wherein the cavities comprise substantially air or other gaseous medium with a refractive index that differs from a refractive index of the material of said second carrier element, said first carrier element, or both said first carrier element and said second carrier element, and wherein the integrated laminate structure further comprises at least two additional carrier elements laminated together such that at least one surface relief pattern of either element is embedded within the laminate structure.

2. The integrated laminate structure of claim 1, wherein said second carrier element is a film, optionally being a bendable film.

3. The integrated laminate structure of claim 1, further comprising an optically functional film.

4. The integrated laminate structure of claim 1, further comprising: an indicative element in the form of a film or a layer provided with a visually indicative surface configured as a visually indicative sign, a poster or plate surface to exhibit a visual message, wherein the visually indicative surface comprises a picture printed thereon and/or a number of printed symbols, letters, and/or numbers.

5. The integrated laminate structure of claim 1, wherein the relief pattern is configured to establish a visual message when cooperating with incident light, wherein the message may exhibit a picture and/or a number of symbols, numbers and/or letters.

6. The integrated laminate structure of claim 1, configured to exhibit informative and/or commercial visual message.

7. The integrated laminate structure of claim 1, comprising at least one element selected from the group consisting of: an embedded relief pattern or a relief form configured to collimate incident light, an embedded relief pattern or a relief form configured for internal light trapping by back-coupling and/or redirecting light back to the direction it arrived at the pattern or form from, and an embedded relief pattern or a relief form configured for internal light coupling and/or redirecting with or without reflective function.

8. The integrated laminate structure of claim 1, further comprising an at least partially embedded multilayer pattern of surface relief forms with a common function or at least jointly designed multiple functions, the multilayer pattern being established by one or more additional carrier elements laminated together in the laminate structure.

9. The integrated laminate structure of claim 1, wherein the optical function of the embedded relief pattern further includes at least one function selected from the group consisting of: light directing function, light trapping function, reflective function, transmissive function, transreflective function, coupling function, incoupling function, outcoupling function, polarizing function, diffractive function, refractive function, anti-glare function, anti-clear function, anti-reflection function, collimating function, pre-collimation function, lens function, converging function, diverging function, wavelength modifying function, scattering function, coloring function, medium distribution function, and diffusing function.

10. The integrated laminate structure of claim 1, wherein the first carrier element, the second carrier element or a further carrier element comprises at least one material selected from the group consisting of: plastic, elastomer, polymer, glass, semiconductor, silicon, adhesive, resin, and ceramic material.

11. The integrated laminate structure of claim 1, further comprising a functional surface layer.

12. The integrated laminate structure of claim 11, wherein said functional surface layer is a coating, a film, a surface relief pattern or a combination thereof and wherein said surface layer has at least one function selected from the group consisting of: anti-reflection function, hydrophobic function, hydrophilic function, and self-cleaning function.

13. The integrated laminate structure of claim 1, wherein the surface relief pattern comprises a number of surface relief forms of sub-micron size.

14. A light coupling or light transmission element, comprising the integrated laminate structure according to claim 1.

15. A light collimation, diffusion or diverging element, comprising the integrated laminate structure according to claim 1.

16. A window structure in the form of an illumination window or an advertising window, comprising the integrated laminate structure according to claim 1.

17. A green house illumination element comprising the integrated laminate structure according to claim 1.

18. An element comprising the integrated laminate structure of claim 1 and having at least one function selected from the group consisting of: light directing function, light trapping function, reflective function, transmissive function, transreflective function, coupling function, incoupling function, outcoupling function, polarizing function, diffractive function, refractive function, anti-glare function, anti-clear function, anti-reflection function, collimating function, pre-collimation function, lens function, converging function, diverging function, wavelength modifying function, scattering function, coloring function, medium distribution function, and diffusing function.

19. The integrated laminate structure of claim 1, wherein the second carrier element has a first surface in which the at least one recessed surface relief pattern is formed having flat surface areas between the recesses, wherein the flat surface areas have a first dimension measured from a first recess to a second recess along a measuring line on the first surface, wherein the recesses define one or more voids of the first surface, and the one or more voids have a second dimension measured from a first flat surface area to a second flat surface area along the measuring line, and wherein the first dimension is greater than the second dimension.

* * * * *